United States Patent
Weber

Patent Number: 5,973,562
Date of Patent: Oct. 26, 1999

[54] AMPLIFIER STAGE WITH CONSTANT INPUT IMPEDANCE

[75] Inventor: Stephan Weber, München, Germany

[73] Assignee: Siemens Aktiengesellschaft, Munich, Germany

[21] Appl. No.: 09/120,604

[22] Filed: Jul. 22, 1998

[30] Foreign Application Priority Data

Jul. 22, 1997 [DE] Germany .......................... 197 31 459

[51] Int. Cl.⁶ ....................................................... H03F 3/45
[52] U.S. Cl. ........................................... 330/252; 330/261
[58] Field of Search .................................. 330/252, 257, 330/261

[56] References Cited

U.S. PATENT DOCUMENTS

| | | | |
|---|---|---|---|
| 3,760,194 | 9/1973 | Lutz et al. ........................... | 307/235 R |
| 4,277,756 | 7/1981 | Kriedt et al. .............................. | 330/261 |
| 4,410,859 | 10/1983 | Kuwahara ................................ | 330/298 |

FOREIGN PATENT DOCUMENTS

| | | |
|---|---|---|
| 2804064 | 6/1980 | Germany . |
| 3932616A1 | 4/1990 | Germany . |
| 2256336 | 12/1992 | United Kingdom . |

*Primary Examiner*—Robert Pascal
*Assistant Examiner*—Henry Choe
*Attorney, Agent, or Firm*—Herbert L. Lerner; Laurence A. Greenberg

[57] ABSTRACT

The amplifier stage of the invention has a first and a second differential amplifier branch and a first and a second impedance-burdened branch. The first impedance-burdened branch is connected in parallel with the input impedance of the first differential amplifier branch, and the second impedance-burdened branch is connected in parallel with the input impedance of the second differential amplifier branch. As a result, it is possible to maintain the amplifier parameters largely constant.

10 Claims, 2 Drawing Sheets

AMPLIFIER STAGE WITH CONSTANT INPUT IMPEDANCE

BACKGROUND OF THE INVENTION

1. Field of the Invention

The invention relates to an amplifier stage of constant input impedance. The amplifier stage of the invention is a regulatable amplifier stage.

2. Description of the Related Art

An emitter-coupled amplifier stage for differential amplification is known from *Electronic Circuits: Design and Applications,* U. Tietze and Ch. Schenk, Springer-Verlag, Berlin 1991, pp. 60–66. A basic circuit of that differential amplifier is illustrated in FIG. 1. A first transistor T1 and a second transistor T2 are connected to one another via the emitter terminals. The common emitter lead is connected to a first reference potential M via a current source I through which a current $I_0$ flows. Input voltages UE1 and UE2 are applied to input terminals E1 and E2, which are connected to the base terminals of the respective transistors T1 and T2. The collectors of the transistors T1 and T2 are connected to output terminals A1 and A2, at which the amplified differential voltage can be picked up. The amplification is adjusted by means of the current source I. The primary disadvantage of this circuit is that the input impedance of the two differential amplifier branches varies sharply with quiescent current.

A differential amplifier is a symmetrical direct voltage amplifier with two inputs and two outputs. The current source in the common emitter lead is definitive. It has the effect that the sum of the emitter currents IE1+IE2=$I_0$ remains constant. In the quiescent state, the input voltage at the terminal E1 is equal to the input voltage at the terminal E2, which in turn is zero (UE1=UE2=0). In that case, the constant current $I_0$ for reasons of symmetry is distributed uniformly to the two transistors T1 and T2. The differential amplification (differential-mode gain) $A_D$ becomes $$A_D = \frac{d\,U_{AI}}{d\,U_D},$$

and the differential voltage $U_D$ becomes $U_D$=UE1−UE2.

However, if the input voltages are varied so that UE1 for instance is greater than UE2, then the current distribution in the differential amplifier changes, so that IC1 (the collector current in the transistor T1) increases and IC2 (the collector current in the transistor 2) decreases. However, the sum of the currents IC1+IC2 remains constant. A difference in the input voltage accordingly causes a change in the output voltage. Differential amplifiers are also used whenever it is not a voltage difference but rather only one of the two input voltages, UE1 or UE2, that is to be amplified. In that case, one of the two inputs E1 or E2 is connected to zero potential.

A special differential amplifier stage has been disclosed by German published, prosecuted patent disclosure DE 28 04 064. There, an emitter-coupled differential amplifier stage is connected to a base-coupled differential amplifier stage. The collectors of the two stages are cross-coupled and form the outputs of the amplifier circuit.

SUMMARY OF THE INVENTION

It is accordingly an object of the invention to provide an amplifier stage with constant input impedance, which overcomes the above-mentioned disadvantages of the prior art devices and methods of this general type, i.e. an amplifier stage of constant input impedance which has the widest possible dynamic range with otherwise largely constant amplifier parameters, such as distortion, noise, etc.

With the foregoing and other objects in view there is provided, in accordance with the invention, an amplifier stage of constant input impedance, comprising:

a first differential amplifier branch with a first transistor having an emitter, a base, and a collector;

a second differential amplifier branch with a second transistor having an emitter, a base, and a collector;

the emitter of the first transistor and the emitter of the second transistor being connected in common, the base of the first transistor being connected to a first input of the amplifier stage, and the base of the second transistor being connected to a second input of the amplifier stage;

a first current source connected between the base of the first transistor and a first reference potential, and a second current source connected between the base of the second transistor and the first reference potential;

a third transistor having an emitter, a base, and a collector, and a fourth transistor having an emitter, a base, and a collector, the base of the third transistor and the base of the fourth transistor being connected in common, and the emitters of the third and fourth transistors being connected to the base terminals of the first and second transistors, respectively;

means connected between the common base terminals of the third and fourth transistors and the first reference potential for adjusting an operating point of the amplifier stage; and a third current source connected between the common base of the third and fourth transistors and a second reference potential;

wherein the collectors of the first, second, third, and fourth transistors form respective outputs of the amplifier stage.

In other words, the impedance-burdened branches that are connected in parallel with the two differential amplifier branches are designed such that, if the input impedance of the differential amplifier branches increases, the impedances of the impedance-burdened branches decrease accordingly.

In accordance with an added feature of the invention, the adjusting means includes one or more diodes.

In accordance with an additional feature of the invention, the first and second current sources are formed by a current mirror having an output connected to the base terminals of the first and second transistors, and an input; and including:

a tenth transistor connected to the input of the current mirror; and a third current source connected between the common base terminals of the third and fourth transistors and the second reference potential.

In other words, along with the above-described four transistors, a current mirror is provided, which is connected on the input side to a further transistor, referred to as the tenth transistor, and on the output side to the base terminals of the first and second transistors. The third current source is connected on the one hand to the base terminals of the third and fourth transistors and on the other to a second reference potential. In a preferred embodiment, the adjusting means is formed by an eighth transistor having a base connected to the common base of the third and fourth transistors and by a ninth transistor having a collector connected to the base of the eighth transistor and an emitter connected to the first reference potential.

In accordance with another feature of the invention, the third current mirror includes a fifth transistor having a collector-to-emitter path connected between the base of the first transistor and the first reference potential and a sixth transistor having a collector-to-emitter path connected between the base of the second transistor and the first reference potential; and the third current mirror includes a seventh transistor which functions as a diode and is connected between the first reference potential and a collector of the tenth transistor; and the base terminals of the fifth, sixth, and seventh transistors are connected in common.

In order for the seventh transistor to function as a diode, its collector terminal is short-circuited to the base terminal.

In accordance with a further feature of the invention, the eighth transistor has a collector connected to the second reference potential and an emitter connected to a fourth current source and to the bases of the ninth and tenth transistors. In other words, the means for adjusting the operating point has an eighth and a ninth transistor, and the base terminal of the eighth transistor is connected to the common base lead of the third and fourth transistors and to the collector terminal of the ninth transistor. The collector terminal of the eighth transistor is connected to the second reference potential, and the emitter terminal is connected to the fourth current source and to the base terminal of the ninth and tenth transistors.

In accordance with again a further feature of the invention, a resistor is connected between each respective current mirror and the first reference potential. Because resistors are connected between the current mirror and the first reference potential, or in other words the emitters of the fifth, sixth and seventh transistor are connected to the first reference potential each via a respective resistor, the variation among mass-produced components can be reduced and linearity can be improved.

In accordance with again an additional feature of the invention, a capacitor is connected between the common base terminals of the third and fourth transistors and the first reference potential. The capacitor provides frequency compensation and thus serves to stabilize the frequency of the amplifier stage.

In accordance with again an added feature of the invention, a resistor is connected between the emitter of the eighth transistor and the first reference potential. This replaces the fourth current source.

In accordance with a concomitant feature of the invention, a resistor may be connected between the emitter terminal of the tenth transistor and the first reference potential. The resistors between the current mirror and the first reference potential and the resistor between the emitter terminal of the tenth transistor and the first reference potential serve the purpose of current counter coupling and thus serve to reduce noise.

The amplifier stage of the invention can be implemented with either pnp or npn transistors. It is also possible to use field effect transistors instead of bipolar transistors.

The circuit according to the invention has two differential amplifier branches, whose input impedances are adjusted in opposite directions, so that the total input impedance remains constant.

Other features which are considered as characteristic for the invention are set forth in the appended claims.

Although the invention is illustrated and described herein as embodied in an amplifier stage with constant input impedance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
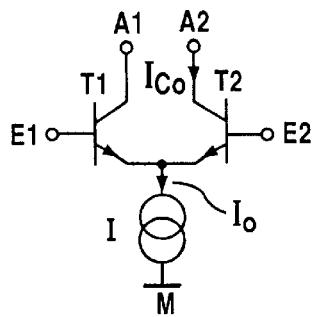
FIG. 1 is a circuit diagram of a prior art differential amplifier.
Figure 2:
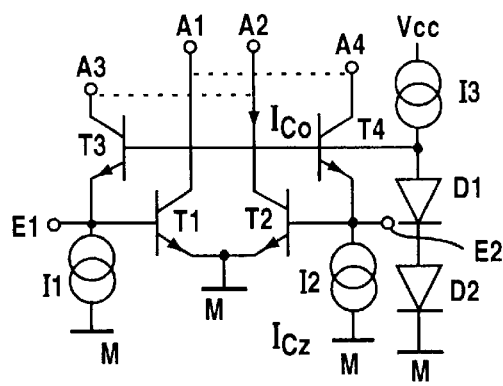
FIG. 2 is a circuit diagram of a basic layout of the amplifier stage according to the invention.

Referring now to the figures of the drawing in detail and first, particularly, to FIG. 2 thereof, there is seen a circuit, similarly to the prior art circuit shown in FIG. 1, has a first differential amplifier branch with the first transistor T1 and a second differential amplifier branch with the second transistor T2. Unlike the prior art in FIG. 1, in FIG. 2 the common emitter lead of the first and second transistors T1 and T2 are connected directly to the first reference potential M. The base terminal of the first transistor T1 leads to the input terminal E1 of the amplifier stage, to a first current source I1, and to the emitter terminal of a third transistor T3. The second terminal of the first current source I1 is connected to the first reference potential M. The base terminal of the second transistor T2 leads to the second input terminal E2 of the amplifier stage, to the emitter terminal of a fourth transistor T4, and to a second current source I2. The second terminal of the second current source I2 is connected to the first reference potential M. The base terminals of the third and fourth transistors T3 and T4 are both connected to one another and their common base lead is connected to the anode terminal of a first diode D1 and of a third current source I3. The second terminal of the third current source I3 is connected to a second reference potential $V_{cc}$. A second diode D2 is connected in series with the first diode D1. The cathode terminal of the second diode D2 is connected to the first reference potential M. The collector terminals of the first, second, third and fourth transistors T1, T2, T3 and T4 lead to the respective output terminals A1, A2, A3 and A4 of the amplifier stage. A current $I_{Cz}$ flows through the second current source I2. The collector current of the second transistor T2 is designated by the symbol $I_{Co}$.

An increase in the input impedance of the emitter circuit formed by the first and second transistors T1 and T2 is compensated for by the circuit of FIG. 2 by connecting a first and a second impedance-burdened branch parallel to the input impedance of the emitter circuit. If the input impedance ZINCE (CE stands for common emitter) increases, then the conductance of the impedance-burdened branch is increased as well. The input impedance ZINCE is determined by the following equation:

$$ZINCE = \beta \cdot UT : I_{Co},$$

in which
β=small-signal current amplification
UT=temperature voltage
$I_{Co}$=collector current.

In the embodiment of FIG. 2, to define the operating point of the amplifier circuit, the low-impedance input impedance of the basic circuit, formed by the third and fourth transistors T3, T4, and of a base-to-emitter diode is used. The input impedance ZINCB (CB=common base) is determined as $$ZINCB = UT:I_{Cz}$$

in which $I_{Cz}$ stands for the current that flows through the second current source I2.

The total input admittance YGES=1/ZGES for the first or second amplifier branch is then obtained as follows:

$$YGES = {}_{ICo}:UT + ICZ:UT + YP$$

in which YP is a parasitic component, which is typically not very current-dependent.

The outputs A3 and A4 of the amplifier stage may, if desired, be connected to the second reference potential $V_{cc}$.

To keep the input impedance ZIN of the amplifier stage constant, the quiescent currents should be adjusted as follows:

$$I_{Co}:\beta UT + I_{Cz}:UT = k$$

It follows from this that $$I_{Cz} = UT \cdot (k - I_{Co}:\beta UT) = k' - I_{Co}:\beta$$

in which k'=UT·k. The supplementary current $I_{Cz}$ accordingly has a constant component k', which is reduced by the extent to which the current $I_{Co}$ rises.

The third current source I3 is used to impress the constant current gain, which depends on the input impedance ZIN. Conversely, the second current source I2 serves to impress the constant current amplification regardless of the input impedance ZIN.

The embodiment shown in FIG. 3 again has a first and a second differential amplifier branch. The emitter terminal of the first transistor T1 is connected, as in FIG. 2, to the emitter terminal of the second transistor T2 and the common emitter lead is connected to the first reference potential M. The base terminal of the first transistor is here connected to the collector of a fifth transistor T5, to the input terminal E1 of the amplifier stage, and to the emitter of the third transistor T3. Symmetrically to this, the base terminal of the second transistor T2 is connected to the collector of a sixth transistor T6, to the second input terminal E2 of the amplifier stage, and to the emitter of the fourth transistor T4. The base terminals of the transistors T3 and T4 disposed in the base circuit are connected to the third current source I3 and to the base of an eighth transistor T8. The second terminal of the third current source I3 is connected to the second reference potential $V_{cc}$ and to the collector terminal of the eighth transistor T8. The emitter of the eighth transistor T8 leads both to a fourth current source I4 and to a common base lead of a ninth transistor T9 and a tenth transistor T10. The emitter terminals of T9 and T10, similarly to the second terminal of the fourth current source I4, are connected to the first reference potential M. The output circuit of the tenth transistor T10 leads to a fifth current source I5, to the collector terminal of a seventh transistor, and to the common base leads of the transistors T5, T6 and T7.

The fifth, sixth and seventh transistors T5, T6 and T7 form a current mirror, which is connected on the input side to the fifth current source I5 and to the tenth transistor T10 and on the output side to the transistors T1 and T2. The transistor T7 is connected as a diode.

An auxiliary current is impressed with the fourth current source I4. This assures that a current flows through the eighth transistor T8. The collector terminals of the first four transistors T1, T2, T3 and T4, in the conventional way, form the outputs A1, A2, A3 and A4, respectively, of the amplifier stage. The current $I_{Co}$ flows through the collector of the second transistor T2. The third current source I3 impresses a current $I_0$, and the fifth current source impresses a current $I_{Cz}$. With the aid of the transistors T8 and T9, the operating point of the amplifier circuit is adjusted.

In addition, it is possible to use emitter resistors, for the sake of less variation among mass-produced components and improved linearity, and to use base resistors to damp oscillation and compensate for the small-signal amplification.

Figure 3:
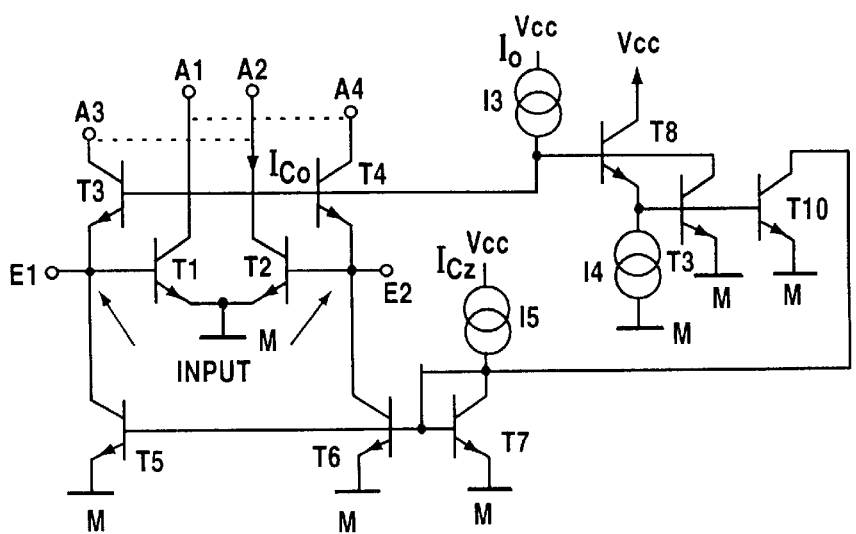
FIG. 3 is a circuit diagram of one embodiment of the amplifier stage of the invention.

In order to regulate the amplifier stage, the current $I_{Cz}$ is kept constant, and $I_0$, which is impressed by the third current source I3, is varied. If the input impedance ZIN can be allowed to vary to a slight extent, then the operating point can be adjusted via current sources as in the embodiment shown in FIG. 4. The circuit arrangement with respect to the transistors T1, T2, T3, T4, T5, T6, T7, T8, T9, T10 and the current sources I3 and I5 is equivalent in this respect to the circuit arrangement shown in FIG. 3. In addition, resistors R5, R6, R7 and R10, respectively, are inserted between the emitter terminals of the transistors T5, T6, T7, T10 and the first reference potential M. The fourth current source I4 of FIG. 3 is here replaced with a resistor R8. In addition, a capacitor C is inserted between the base terminals of the transistors T3 and T4 and the first reference potential M.

The resistors R5, R6, R7 and R10 serve the purpose of current counter-coupling and thus of noise reduction. The capacitor C is used for frequency compensation and thus to stabilize the amplifier stage. The collectors of the base circuit (transistors T3 and T4) are applied to the second reference potential $V_{cc}$, so that the amplification at a low current $I_0$ drops and the regulation range is widened. In addition, the current mirror (transistors T5, T6, T7) controls the current $I_0$ and simultaneously $I_{Cz}$. This brings about more of a sliding variation in the input impedance ZIN.

It will be understood by those skilled in the art that, in principle, the npn transistors shown in the drawing may be replaced with pnp transistors or field effect transistors. The push-pull emitter circuit can also be replaced with a normal differential amplifier with a current source.

Figure 4:
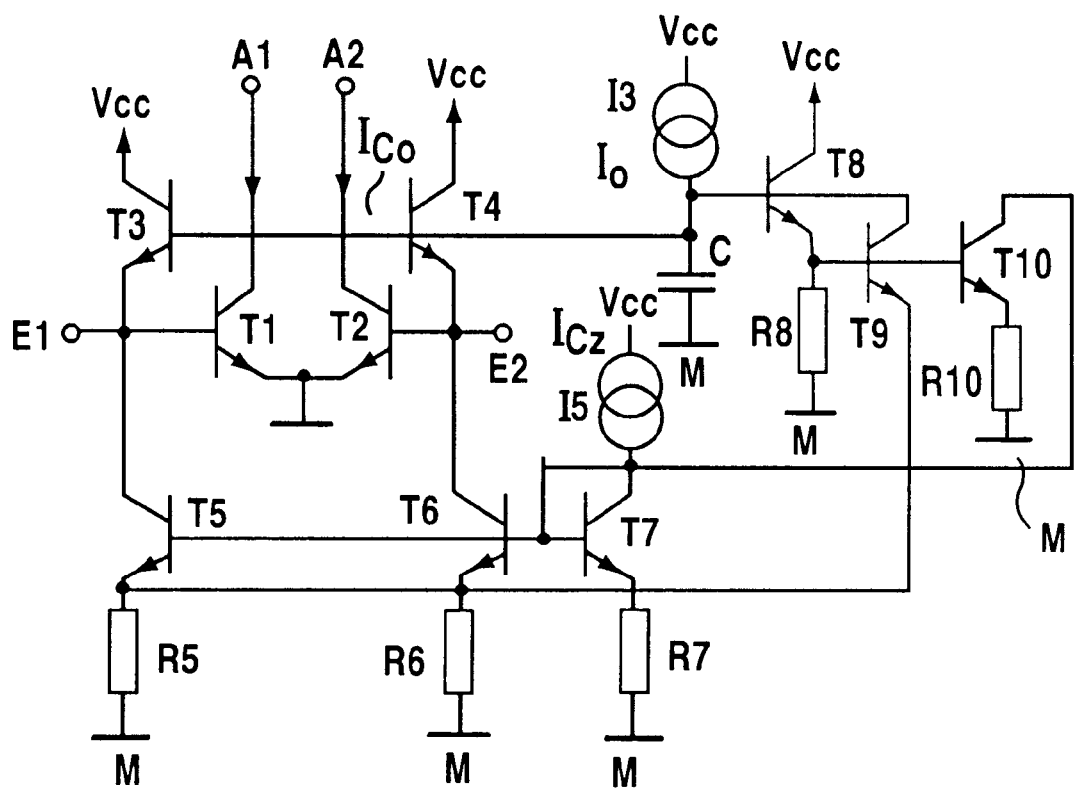
FIG. 4 is a circuit diagram of a further embodiment of the amplifier stage of the invention.

The emitter resistors shown in FIG. 4 serve to reduce the variation from one example to another and to improve the linearity of the circuit.

I claim:

1. An amplifier stage of constant input impedance, comprising:

a first differential amplifier branch with a first transistor having an emitter, a base, and a collector;

a second differential amplifier branch with a second transistor having an emitter, a base, and a collector;

said emitter of said first transistor and said emitter of said second transistor being connected in common, said base of said first transistor being connected to a first input of the amplifier stage, and said base of said second transistor being connected to a second input of the amplifier stage;

a first current source connected between said base of said first transistor and a first reference potential, and a second current source connected between said base of said second transistor and the first reference potential;

a third transistor having an emitter, a base, and a collector, and a fourth transistor having an emitter, a base, and a collector, said base of said third transistor and said base of said fourth transistor being connected in common, and said emitters of said third and fourth transistors being connected to said base terminals of said first and second transistors, respectively;

means connected between said common base terminals of said third and fourth transistors and the first reference potential for adjusting an operating point of the amplifier stage; and a third current source connected between said common base of said third and fourth transistors and a second reference potential;

wherein said collectors of said first, second, third, and fourth transistors form respective outputs of the amplifier stage.

2. The amplifier stage according to claim 1, wherein said adjusting means includes at least one diode.

3. The amplifier stage according to claim 1, wherein said first and second current sources are formed by a current mirror having an output connected to said base terminals of said first and second transistors, and an input; and including:

a tenth transistor connected to said input of said current mirror; and a third current source connected between said common base terminals of said third and fourth transistors and the second reference potential.

4. The amplifier stage according to claim 3, wherein said adjusting means is formed by an eighth transistor having a base connected to said common base of said third and fourth transistors and by a ninth transistor having a collector connected to said base of said eighth transistor and an emitter connected to the first reference potential.

5. The amplifier stage according to claim 3, wherein:

said third current mirror includes a fifth transistor having a collector-to-emitter path connected between said base of said first transistor and the first reference potential and a sixth transistor having a collector-to-emitter path connected between said base of said second transistor and the first reference potential; and said third current mirror includes a seventh transistor connected as a diode and connected between the first reference potential and a collector of said tenth transistor; and said base terminals of said fifth, sixth, and seventh transistors being connected in common.

6. The amplifier stage according to claim 4, which further comprises a fourth current source, and wherein said eighth transistor has a collector connected to the second reference potential and an emitter connected to said fourth current source and to said bases of said ninth and tenth transistors.

7. The amplifier stage according to claim 6, which further comprises a plurality of resistors each connected between a respective said current mirror and the first reference potential.

8. The amplifier stage according to claim 1, which further comprises a capacitor connected between said common base terminals of said third and fourth transistors and the first reference potential.

9. The amplifier stage according to claim 4, which further comprises a resistor connected between said emitter of said eighth transistor and the first reference potential.

10. The amplifier stage according to claim 3, which further comprises a resistor connected between said emitter of said tenth transistor and the first reference potential.

* * * * *